United States Patent [19]
Jang

[11] Patent Number: 5,267,194
[45] Date of Patent: Nov. 30, 1993

[54] ELECTRICALLY ERASABLE PROGRAMMABLE READ-ONLY-MEMORY CELL WITH SIDE-WALL FLOATING GATE

[75] Inventor: Wen-Yueh Jang, Taipei, Taiwan

[73] Assignee: Winbond Electronics Corporation, Hsinchu, Taiwan

[21] Appl. No.: 752,723

[22] Filed: Aug. 30, 1991

[51] Int. Cl.$^5$ .............................................. H01L 29/78
[52] U.S. Cl. .................................... 365/185; 257/328; 257/327; 365/900; 365/218
[58] Field of Search ............... 365/185, 900; 357/23.5, 357/23.1, 23.3; 257/328, 327

[56]  References Cited
U.S. PATENT DOCUMENTS
5,095,344  3/1992  Harari ................................. 365/900

Primary Examiner—Eugene R. LaRoche
Assistant Examiner—Viet Q. Nguyen
Attorney, Agent, or Firm—Skjerven, Morrill, MacPherson, Franklin & Friel

[57] ABSTRACT

A small and shrinkable EEPROM cell and method of forming such a cell are provided which includes a control gate having a reentrant profile and a side-wall floating gate conforming to that profile. A predetermined portion of the floating gate overlies the source region which accelerates programming speed. The reentrant profile of the floating gate under the control gate accelerates erasing of the cell. Because of the self-aligned structure of the cell, the EEPROM has a small cell area and is insensitive to layer misalignment. Because of its configuration, the EEPROM cell is easily incorporated into an array of like cells sharing a common source region which facilitates "flash" erasing.

10 Claims, 4 Drawing Sheets

ELECTRICALLY ERASABLE PROGRAMMABLE READ-ONLY-MEMORY CELL WITH SIDE-WALL FLOATING GATE

FIELD OF THE INVENTION

The present invention relates to the field of electrically erasable programmable read-only-memories (EEPROMs) and, in particular, to EEPROMs using side-wall floating gates.

BACKGROUND OF THE INVENTION

EEPROMs having long-term retention of electric charge are well-known in the art as information-storage devices. An EEPROM is characterized by having a floating gate to which there is no direct electrical connection and a control gate with a direct electrical connection. The floating gate is separated from a substrate region by an insulating layer of, for example, silicon dioxide. The substrate region typically includes symmetrical source and drain regions (below the floating gate) which define a channel. The control gate of the EEPROM is generally positioned over the floating gate with a layer of insulating material separating the two gates. To program a transistor, charge is transferred from the substrate through the insulator and is stored on the floating gate of the transistor. Programming and erasing of an EEPROM are done using voltage pulses that either place charge on or remove charge from the floating gates in selected memory cells.

Typically, programming an EEPROM is accomplished by hot electron channeling. For hot electron channeling to occur, a sufficiently high voltage is applied to the control gate and drain with the source being grounded to create a flow of electrons in the channel region. Some of these hot electrons have enough energy to channel through the insulator to charge the floating gate. This negative charge remains after the high voltage is removed, thereby leaving the EEPROM with a higher threshold voltage than that obtained without the negative charge on the floating gate (i.e. in a continuous "off" state). Thus, even when a logic high is applied to the control gate, the EEPROM remains off.

One disadvantage of hot electron channeling is that the high voltages needed to program are generally not available on-circuit. Hence, external programming circuitry must be used.

Erasing of an EEPROM is generally based on Fowler-Nordheim tunneling of electrons from the floating gate to the source. This tunneling is accomplished by grounding the control gate and raising the voltage in the source region, thereby causing the stored charge on the floating gate to flow back to the substrate. Of critical importance is the thinness of the insulating layer surrounding the floating gate. Typically, the thickness of the insulating layer between the floating gate and the substrate must be in the rang of 10 nanometers to facilitate Fowler-Nordheim tunneling.

However, thin oxides are difficult to achieve without defects. Because the retention of information by an EEPROM is limited by defect density, high endurance is exceedingly difficult to attain. Additionally, reliability problems may occur as high voltages cause charge to pass through defective oxide, thereby causing the loss of valuable data.

Therefore, a need arises for a small and shrinkable EEPROM which achieves high speed programming and erasing with low power.

SUMMARY OF THE INVENTION

A small and shrinkable EEPROM cell and method of forming such a cell are provided which includes a control gate with a reentrant profile, and a floating gate adjacent to and conforming to the reentrant profile in the control gate. The control gate and floating gate are insulated from each other and from a substrate region which includes a source region, a drain region, and a channel region. The thickness of the insulating material between the floating gate and the control gate is grown to a predetermined thickness to minimize oxide defects, thereby increasing cell performance. The floating gate overlies a predetermined portion of the source and channel regions to improve the efficiency of hot electron channeling while programming the cell. The side of the floating gate adjacent to the control gate has a protrusion which partially underlies the control gate to conform to the reentrant profile of the control gate. This configuration enhances Fowler-Nordheim tunneling of the electrons from the floating gate to the control gate while erasing the cell. Moreover, the EEPROM's structure allows achievement of high speed erasing with a low injection electric field. Finally, the EEPROM is easily implemented in a large EEPROM cell array having a common source region to facilitate "flash" erasing.

DETAILED DESCRIPTION OF THE DRAWINGS

In accordance with the present invention, a structure for an EEPROM cell includes a floating gate which, instead of being positioned between a control gate and a channel region of a substrate, is positioned laterally to the control gate. The floating gate has a protrusion which extends beneath a portion of the control gate to accelerate erasing.

Fabrication of this EEPROM cell begins with a substrate of P-type silicon. It will be appreciated by those skilled in the art that the drawings are not to scale and have been highly enlarged for illustration purposes. Conventional processing steps are used to form the well in the cell, as well as implant isolation areas. In particular, local oxidation of silicon (LOCOS) is used for isolation purposes. In this process, a patterned layer of silicon nitride prevents oxidation of the semiconductor material under the silicon nitride and allows this semiconductor material to be used for the formation of active devices. This nitride is stripped before subsequent processing steps are performed. Because the steps associated with the local oxidation of silicon are well-known in the art, further description of these steps is not provided.

Following the local oxidation of the semiconductor material, the substrate is implanted with boron 11 at an energy of 160 keV (kilo-electron volt) and a total dosage of $2 \times 10^{11}$ ions/cx$^2$. Therefore, if the beam current of the implanter is large, the implantation time is short and vice-versa. Hence, the specified total implantation dosage is in dependent of time. This first implantation enhances anti-punchthrough, which will be described in further detail below. A second implantation of boron 11 is then performed on the substrate at an energy of 25 keV and a total dosage of $2.2 \times 10^{12}$ ions/cm$^2$ to adjust the threshold voltage of the control gate.

Figure 3:
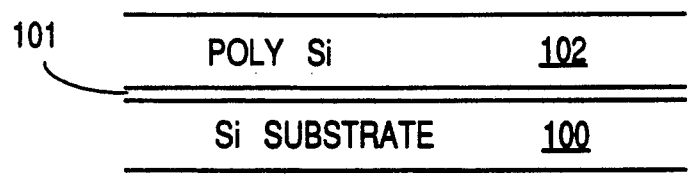
FIG. 3 illustrates a cross section of the initial structure used in the formation of the EEPROM cell in accordance with this invention.

FIG. 3 illustrates in cross-section a portion of the semiconductor wafer at the start of the process of this invention. Specifically, substrate 100, preferably silicon, has formed on its top surface silicon dioxide layer 101, and polysilicon layer 102. In one embodiment of the present invention, silicon dioxide layer 101 is thermally grown to a thickness of 400 Å and the polysilicon layer 102 is deposited to a thickness of 3,000 Å. The structure as shown in FIG. 3 is then doped with phosphorous 31 at an energy of 60 keV and a total dosage of $1.5 \times 10^{16}$ ions/cm$^2$ to form a conductive layer of polycrystalline silicon which will subsequently be used to form a plurality of conductive control gates on the EEPROM.

Figure 4:
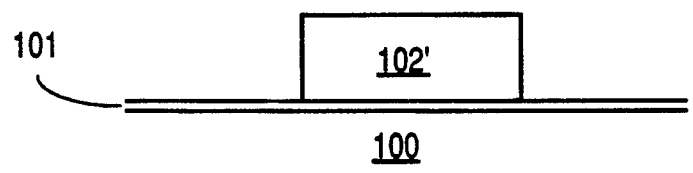
FIG. 4 shows the formation of the control gate after etching of the polysilicon layer.

Using conventional processes, a photoresist (not shown) is formed on the structure of FIG. 3 and an opening is formed in the photoresist. Then, the polysilicon layer 102 is anisotropically etched to form the control gate 102' as shown in cross-section in FIG. 4. At this point, the cell is implanted with boron 11 at an energy of 100 keV and a total dosage of $8 \times 10^{12}$ ions/cm$^2$, using the control gate 102' as a mask, to adjust the threshold voltage of the floating gate (shown later in FIG. 9). Note that all implantations have been done without masks.

Figure 5:
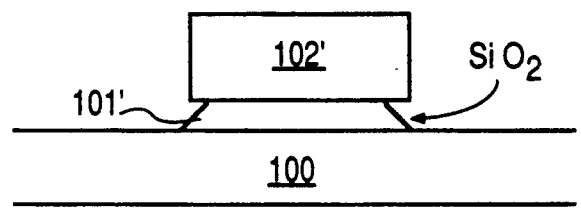
FIG. 5 illustrates the formation of the reentrant profile under the control gate.
Figure 6:
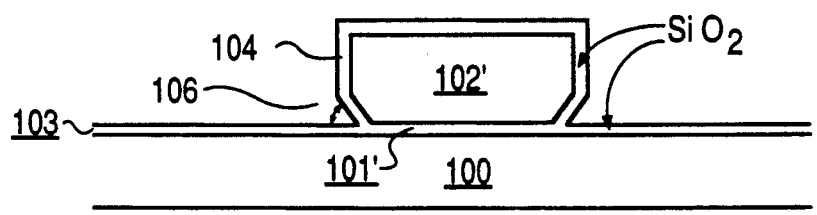
FIG. 6 shows the structure of FIG. 5 after growing of an oxide which insulates the control gate.

The reentrant profile under the control gate is formed by etching the silicon dioxide layer 101' as seen in FIG. 5. This etch is performed with a buffer oxide etchant (BOE) in a ratio of 20:1. In this etching step, the oxide 101' is over-etched, thereby forming an undercut under control gate 102'. As seen in FIG. 6, silicon dioxide layers 103, 104 are then thermally grown over the structure of FIG. 5 to insulate control gate 102' from floating gate 105' (shown in FIG. 9). In one embodiment of the present invention, oxide layer 103 has a thickness of 150 Å and is formed with an oxygen/nitrogen combination (O$_2$:N$_2$ at a volume ratio of 1:2) at 950° C. Referring to FIG. 6, silicon dioxide layer 104 grows as it consumes some of the polysilicon of control gate 102'. In one embodiment, silicon dioxide layer 104 grows to approximately 400 Å. Repeating the steps of etching the oxide with buffer oxide etchant and growing oxide on the substrate further sharpens (decreases) the reentrant angle 106 (explained in detail later) which conforms to the reentrant profile of control gate 102'. Typically, this process is performed once or twice. If a second etching and growing of the oxide on the substrate is required, the new oxide layer 13 is grown to about 200 Å, instead of 150 Å for a one time process. As mentioned above, this second oxide etching sharpens (decreases) the reentrant angle 106.

Figure 11:
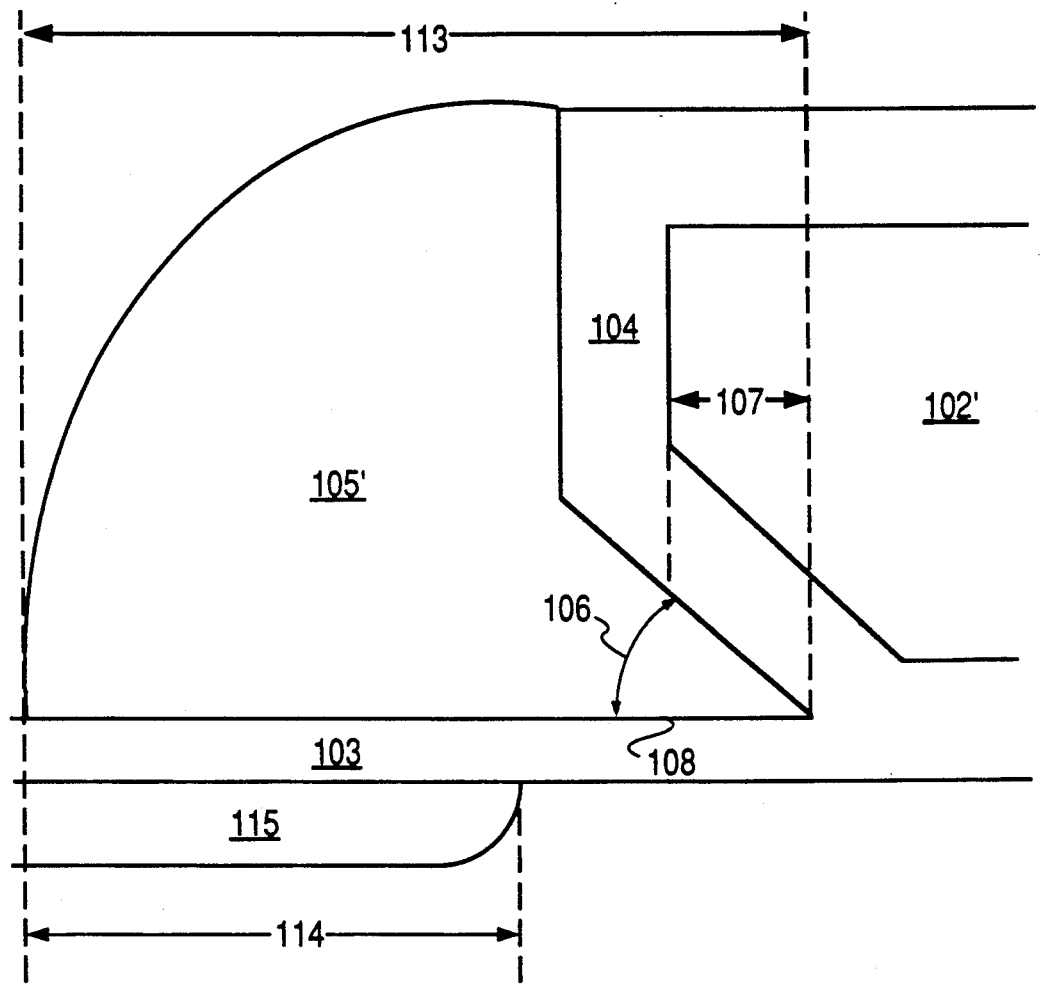
FIG. 11 shows an enlarged view of the floating gate in the final structure.

The reentrant structure, which is shown in enlarged detail in FIG. 11, has a protrusion 108 which has an angle 106 of approximately 30°. This protrusion 108 extends beneath control gate 102' a distance of 107 which is typically 0.1 micrometers. By forming the reentrant profile under the control gate in a manner described in the preceding paragraph, the reentrant profile is partially controlled by the oxide etching process, and is also partially controlled by the oxidation growing process. The oxidation temperature and the impurity concentration of control gate 102' determine the oxide thickness ratio between the single crystal oxide as formed in layer 103 and the polyoxide layer 104. An oxide thickness ratio of about 1:3 for single crystal oxide 103 versus polyoxide 104 is considered optimal. The tunneling current is used to determine whether angle 106 is properly formed.

Figure 7:
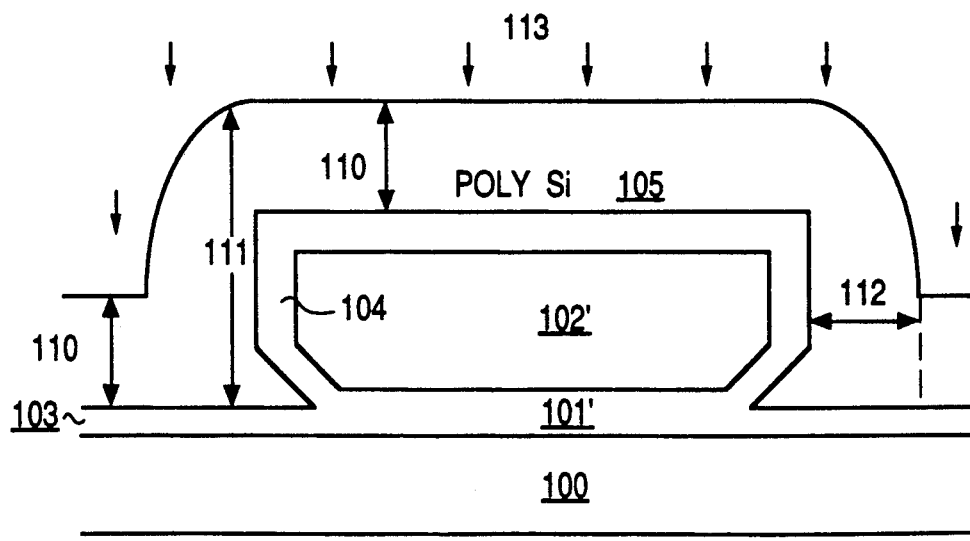
FIG. 7 illustrates the deposition of a second polysilicon layer.

FIG. 7 illustrates deposition of a second polysilicon layer 105 over the structure of FIG. 6. In one embodiment of this invention, polysilicon layer 105 has a thickness 110 of 5000 Å and is doped with phosphorous 31 at an energy of 100 keV and a total dosage of $1.2 \times 10^{15}$ ions/cm$^2$. Polysilicon layer 105 must be doped to reduce the polyresistance, thereby allowing the electrons to move freely in floating gate 105'. On the other hand, the implant dosage must not be too high, thereby resulting in too much consumption of polysilicon spacers 105' during backend oxidation cycles, i.e. impurity enhanced oxidation. The polysilicon thickness 112 which is formed laterally to control gate 102' must be equal to polysilicon thickness 110 which is formed both above the control gate 102 and on top of substrate 100 because of subsequent etching described below.

As shown in FIG. 7, anisotropic etching is performed on polysilicon layer 105 in the direction indicated by arrows 113. Because thickness 111 is thicker than thickness 110 and thickness 110 is equal to width 112, resulting polyspacers 105', as seen in FIG. 8, will remain after this anisotropic etching.

Figure 8:
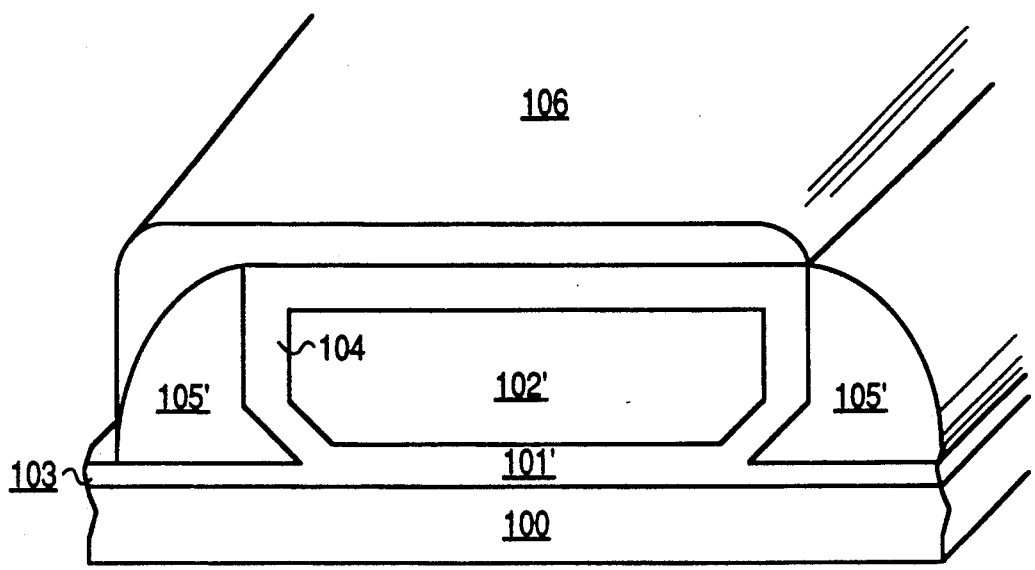
FIG. 8 illustrates the structure of FIG. 7 after an anisotropic etch of the second polysilicon layer.
Figure 9:
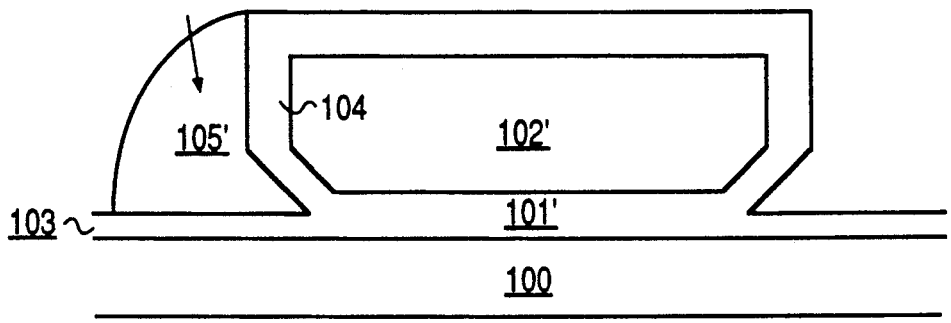
FIG. 9 shows the final formation of the floating gate in accordance with the present invention.
Figure 10:
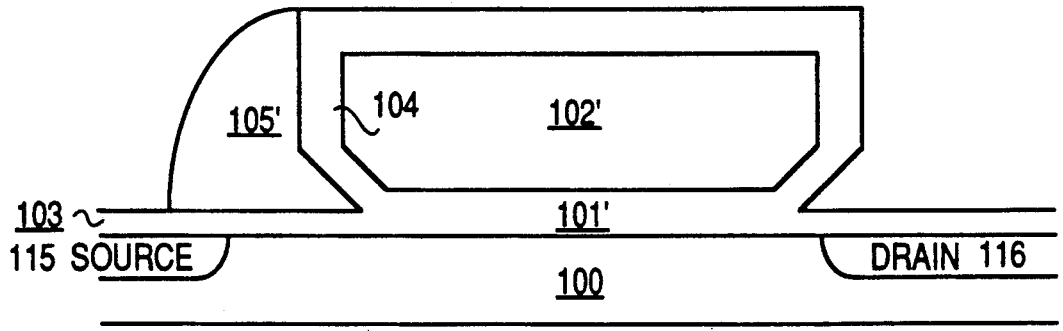
FIG. 10 illustrates formation of source and drain regions in the substrate subsequent to the formation of the floating gate.

Refering to FIG. 8, a stringer mask 106 is then placed over the structure of FIG. 8. A subsequent isotropic etch removes one of the two polyspacers 105' as shown in FIG. 9. FIG. 10 illustrates formation of source region 115 and drain region 116 in substrate 100 by an arsenic implantation performed at an energy of 80 keV and a total dosage of $5 \times 10^{15}$ ions/cm$^2$. Note that source region 115 and drain region 116 are formed using control gate 102' and floating gate 105, as masks during the arsenic implantation. A conventional annealing step is performed to drive in the source region 115 and drain region 116.

FIG. 11 shows an enlarged view of the resulting floating gate 105' in relation to control gate 102' and source region 115. The floating gate length 113 must not be shorter than approximately 0.4 micrometers. If length 113 is shorter than 0.4 micrometers, excluding the overlay 114 between floating gate 105' and source region 115 (which provides sufficient coupling between floating gate 105' and source 115, described in further detail later), the remaining channel length under floating gate 105' is shorter than 0.1 micrometers which is insufficient to control the cell threshold voltage. The thickness of insulation layer 104 between floating gate 105' and control gate 102' is limited by the available voltage between these two areas. Typically, the voltage difference between control gate 102' and floating gate 105' is about 10 volts, hence the maximum insulation thickness 104 is approximately 500 Å. Because the oxide layer 103 is grown at the same time as that of insulation layer 104, the oxide thickness for the floating gate oxide 103 and polyoxide 104 is kept to a ratio of about 1:3 to 1:2 to optimize the cell performance. The deposition of polysilicon in this invention is generally done with the use of a conventional low pressure chemical vapor deposition (LPCVD) furnace. In this manner, a uniform second polysilicon layer is easily deposited.

Backend processes such as planarization, forming the contact hole opening, metal sputtering, etc. are conventional and well known in the art and therefore are not explained in further detail.

Figure 1:
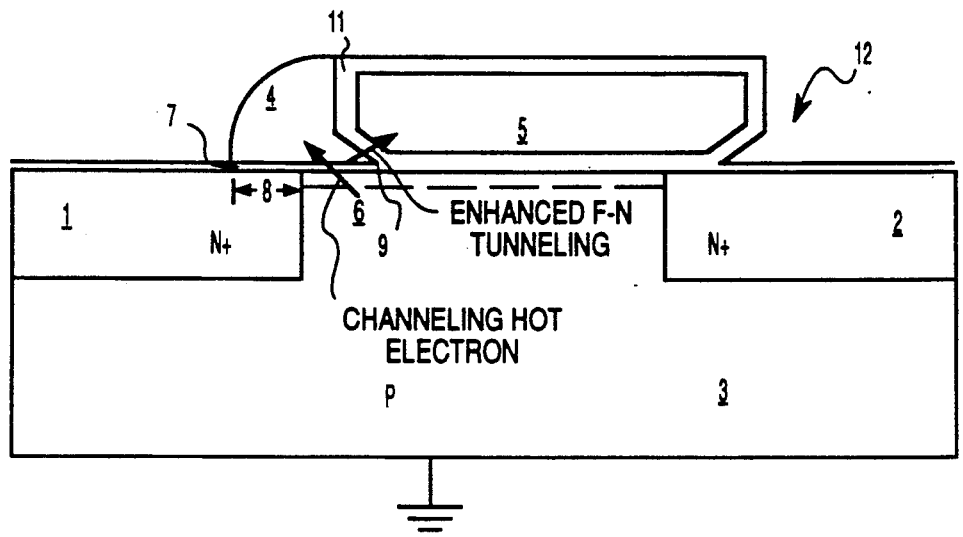
FIG. 1 illustrates an EEPROM cell in accordance with the present invention.

Referring to FIG. 1, during programming of this EEPROM cell, control gate 5 is held at approximately 2 volts which is sufficient to form a channel 6 between source 1 and drain 2, and a small reverse voltage of, for example, 0.5 volts is applied between drain 2 and substrate 3 to prevent the cell from punchthrough, i.e. where the depletion region of one junction extends completely through an intermediate region to another junction, causing a sharp increase in current. A high enough voltage, for example 12 volts, is applied to source 1 to accelerate the electrons in channel 6 between control gate 5 and floating gate 4. This source voltage provides floating gate 4 with sufficient positive potential through capacitive coupling to enhance the injection of the hot electrons. Therefore, the isolation layer 7 between floating gate 4 and source 1 must be thin enough, i.e. approximately 150 Å, and the overlay 8 (see also distance 114 in FIG. 11) between them must be larger than 0.3 μm, for example, to attain a high capacitive coupling ratio.

Using this programming method, an inversion layer is formed under control gate 5 which inversion layer is at the drain potential. On the other hand, a deep depletion layer is formed under floating gate 4 which depletion region is at or close to the source potential. As a result, a large potential gap is created in the weak gate controlled channel region 6 between control gate 5 and floating gate 4. Therefore, electrons from drain 2 will be accelerated in channel region 6. The accelerated electrons (hot electrons) will be attracted to floating gate 4 upon arrival in the channel region 6 under floating gate 4. In this manner, the lateral field for electron acceleration does not affect the vertical field for electron injection, as would typically be the case. Because the maximum lateral field for electrons acceleration and vertical field for electrons injection are independent from one another, the electron injecting efficiency is high. Because substrate 3 under floating gate 4 is subsequently depleted of electrons due to the storage of electrons on floating gate 4, the memory cell threshold voltage is increased, thereby decreasing cell current. This creates a logic "0" state.

During erasing, source 1 is grounded, drain 2 is left floating (i.e. not connected to any voltage node), and control gate 5 is held at a high voltage of, for example, 15 volts. Due to the high capacitive coupling ratio between floating gate 4 and source 1, and the low capacitive coupling ratio between control gate 5 and floating gate 4, the voltage difference between control gate 5 and floating gate 4 will be large enough for cell erasing. Typically, a difference of 10 volts is attained. Thus, although the polyoxide layer 11 between control gate 5 and floating gate 4 is thick enough, i.e approximately 400 Å, to keep the capacitive coupling ratio between the gates low, the protrusion 9 of floating gate 4 under control gate 5 in accordance with the present invention greatly enhances the electric field. Therefore, during erasing, the electrons of floating gate 4 will quickly flow from protrusion 9 to control gate 5 by enhanced Fowler-Nordheim tunneling. In this manner, floating gate 4 is erased to a positive potential and a conduction channel is formed underneath it. Thus, the memory cell threshold voltage is decreased and the cell current is from no current conduction for one logic state, say logic "0", to a current condition for the other logic state, say a logic "1".

Note that the threshold voltage is defined as the control gate voltage when the drain current arrives at a predetermined current, for example 0.1 microamps, under a drain voltage of, for example, 0.1 volts. When the cell is programmed, i.e., the floating gate is filled with electrons that has a negative potential, the channel region under the floating gate is fully depleted. Therefore, very little current flows no matter how large the applied control gate voltage is. As a result, the threshold voltage is high. On the other hand, when the cells are erased, i.e., the floating gate is depleted of electrons and has a positive potential, the channel region under the floating gate is inverted and provides a conduction path between the drain and the source. Hence, the threshold voltage is greatly reduced.

To guarantee the cell is completely erased, the EEPROM cell is over-erased, i.e. the floating gate has a net positive charge or has a positive potential. Over-erasing causes a weak inversion channel to be formed under floating gate 4. Without control gate 5, the weak inversion channel would form a leakage path for the cell current. Hence, control gate 5 prevents undesirable leakage current due to over-erasing by closing the channel completely.

Because the polyoxide layer 11 between control gate 5 and floating gate 4 is limited to the side-wall of the floating gate 4, the capacitive coupling between the two gates can easily be decreased by increasing the thickness of polyoxide layer 11. Similarly, the capacitive coupling between floating gate 4 and source 1 can easily be enlarged by decreasing the thickness of insulation layer 7 and/or increasing overlay 8. In other words, the capacitive coupling between the control gate and the floating gate must be minimized, and that between the floating gate and source must be maximized to optimize the cell performance. During the programming procedure, if the coupling between the floating gate and source is large, the floating gate potential will be high which helps the channel electrons inject onto the floating gate. On the other hand, during the erasing procedure, the coupling between the control gate and the floating gate must be low, therefore there must be a large voltage difference between the control gate and the floating gate to help erase the floating gate. Thus, the floating gate potential can easily be increased, thereby improving the injection efficiency during programming. Additionally, as seen above during erasing, the floating gate potential decreases, thereby increasing the voltage difference between control gate 5 and floating gate 4 which increases the erasing speed. Thus, both the programming and erasing capabilities of an EEPROM in accordance with the present invention are dramatically improved.

The high voltage required for cell programming and erasing may be provided by charge pumping circuitry. Due to the high output resistance of the circuit, the circuit is able to supply high voltage provided that the output current is low, i.e. the loading must not be high. If only conventional programming methods are used, the injection efficiency is low which means that the required programming current must be large. Therefore, if conventional programming methods are utilized, a charge pumping circuit cannot be used. However, in accordance with the present invention, due to the high injection efficiency of the proposed programming method, the programming current is about 10 nA per cell. Hence, a charge pumping circuit may be used. Charge pump circuitry can be formed on chip thereby avoiding the need for external programming circuitry.

Figure 2:
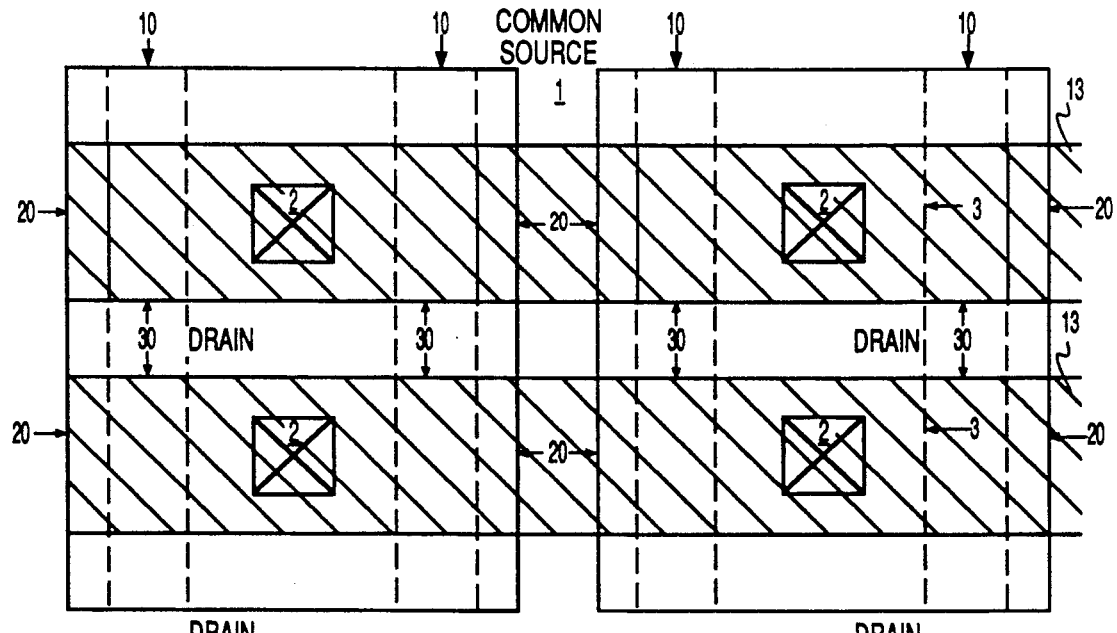
FIG. 2 illustrates a plurality of EEPROM cells in an array which allows for flash erasing.

In one embodiment of the present invention illustrated in FIG. 2, an integrated circuit memory has a multiplicity of the memory cells. The control gate 5, as seen in cross-section in FIG. 1, of each cell is connected to one of a plurality of word lines 10 (formed by the first polysilicon layer). Similarly, the drain 2 of each cell, also as seen in FIG. 1, is connected to one of a plurality of bit lines 13 of the memory circuit. The positions of the floating gates 4, accomplished by the second polysilicon layer, are indicated by arrows 20, whereas the positions of control gates 5, accomplished by the first polysilicon layer, are indicated by arrows 30.

When information is required, i.e. the EEPROM is to be read, the voltage of the selected word line 10 is raised to approximately 4 volts to turn on the cell, the source 1 is grounded, and a fixed drain voltage of, for example, 2 volts is applied to provide current in the cell. The sense amplifier (not shown) connected to a selected bit line 13 detects the magnitude of the current, determines what the stored information is, and outputs the corresponding voltage for it.

Therefore, by constructing storage devices in accordance with the present invention as shown in FIG. 1, and by combining such devices in a memory cell array according to FIG. 2, a high density memory cell array is fabricated without any trade off between device characteristics and process complexity. Furthermore, in addition to the normal byte erasing mode of a standard EEPROM cell array, the common source structure of the proposed cell array facilitates erasing by "flash" mode, i.e., the cell array can be erased either by a block or by a whole chip by applying a high voltage to a block of control gates or to all control gates.

The preceding description is meant to be illustrative only and not limiting. Those skilled in the art will be able to fabricate other devices in accordance with this invention based on the above description.

I claim:

1. An array of electrically erasable programmable read-only memory cells, wherein at least two adjacent cells share a common source region and each of said cells has a structure comprising:
    a semiconductor substrate containing a source region and a drain region extending to a surface of said substrate, said source and drain regions being separated by a channel region;
    a control gate formed over but insulated from said channel region, a surface of said control gate being substantially parallel to said surface of said substrate, said control gate having a reentrant profile; and
    a floating gate positioned laterally adjacent to but insulated from said control gate, and overlying but insulated from a portion of said source region and a portion of said channel region, said floating gate including a protrusion on a side adjacent to said control gate, said protrusion conforming to said reentrant profile of said control gate.

2. A structure for an electrically erasable programmable read-only-memory comprising:
    a semiconductor substrate containing a source region and a drain region extending to a surface of said substrate, said source and drain regions being separated by a channel region;
    a control gate formed over but insulated from said channel region, a surface of said control gate being substantially parallel to said surface of said substrate, said control gate having a reentrant profile; and
    a floating gate positioned laterally adjacent to but insulated from said control gate, and overlying but insulated from a portion of said source region and a portion of said channel region, said floating gate including a protrusion on a side adjacent to said control gate, said protrusion conforming to said reentrant profile of said control gate, and wherein said floating gate is insulated from said source and said channel region by an insulating layer no more than approximately 150 Å thick.

3. A structure of claim 2 wherein said floating gate laterally overlies said source region by approximately 0.3 μm.

4. A structure of claim 3 wherein said floating gate is insulated from said control gate by an insulating layer at least approximately 400 Å thick.

5. A structure for an electrically erasable programmable read-only-memory comprising:
    a semiconductor substrate containing a source region and a drain region extending to a surface of said substrate, said source and drain regions being separated by a channel region;
    a control gate formed over but insulated from said channel region, a surface of said control gate being substantially parallel to said surface of said substrate, said control gate having a reentrant profile; and
    a floating gate positioned laterally adjacent to but insulated from said control gate, and laterally overlying but insulated from a portion of said source region and a portion of said channel region, said floating gate including a protrusion on a side adjacent to said control gate, said protrusion conforming to said reentrant profile of said control gate, and wherein said floating gate laterally overlies said source regions by at least approximately 0.3 μm.

6. A structure for an electrically erasable programmable read-only-memory comprising:
    a semiconductor substrate containing a source region and a drain region extending to a surface of said substrate, said source and drain regions being separated by a channel region;
    a control gate formed over but insulated from said channel region, a surface of said control gate being substantially parallel to said surface of said substrate, said control gate having a reentrant profile; and a floating gate positioned laterally adjacent to but insulated from said control gate, and laterally overlying but insulated from a portion of said source region and a portion of said channel region, said floating gate including a protrusion on a side adjacent to said control gate, said protrusion conforming to said reentrant profile of said control gate, and wherein said floating gate is insulated from said control gate by an insulating layer at least approximately 400 Å thick.

7. A structure for an electrically erasable programmable read-only-memory comprising:

a semiconductor substrate containing a source region and a drain region extending to a surface of said substrate, said source and drain regions being separated by a channel region;

a control gate formed over but insulated from said channel region, a surface of said control gate being substantially parallel to said surface of said substrate, said control gate having a reentrant profile; and a floating gate positioned laterally adjacent to but insulated from said control gate, and laterally overlying but insulated from a portion of said source region and a portion of said channel region, said floating gate including a protrusion on a side adjacent to said control gate, said protrusion conforming to said reentrant profile of said control gate, and said protrusion having an angle of approximately 30 degrees.

8. A structure for an electrically erasable programmable read-only-memory comprising:

a semiconductor substrate containing a source region and a drain region extending to a surface of said substrate, said source and drain regions being separated by a channel region;

a control gate formed over but insulated from said channel region, a surface of said control gate being substantially parallel to said surface of said substrate, said control gate having a reentrant profile; and a floating gate positioned laterally adjacent to but insulated from said control gate, and laterally overlying but insulated from a portion of said source region and a portion of said channel region, said floating gate including a protrusion on a side adjacent to said control gate, said protrusion conforming to said reentrant profile of said control gate, and said protrusion extending laterally beneath said control gate by approximately 0.1 micrometers.

9. A structure for an electrically erasable programmable read-only-memory comprising:

a semiconductor substrate containing a source region and a drain region extending to a surface of said substrate, said source and drain regions being separated by a channel region;

a control gate formed over but insulated from said channel region, a surface of said control gate being substantially parallel to said surface of said substrate, said control gate having a reentrant profile; and a floating gate positioned laterally adjacent to but insulated from said control gate by a first insulating layer, said floating gate laterally overlying but insulated from a portion of said source region and a portion of said channel region by a second insulating layer, said floating gate including a protrusion on a side adjacent to said control gate, said protrusion conforming to said reentrant profile of said control gate, and wherein said first insulating layer is approximately two to three times thicker than said second insulting layer.

10. A structure for an electrically erasable programmable read-only-memory comprising:

a semiconductor substrate containing a source region and a drain region extending to a surface of said substrate, said source and drain regions being separated by a channel region;

a control gate formed over but insulated from said channel region by an insulating layer approximately 400 Å thick, a surface of said control gate being substantially parallel to said surface of said substrate, said control gate having a reentrant profile; and a floating gate positioned laterally adjacent to but insulated from said control gate, and overlying but insulated from a portion of said source region and a portion of said channel region, said floating gate including a protrusion on a side adjacent to said control gate, said protrusion conforming to said reentrant profile of said control gate.

* * * * *